(12) United States Patent
Fan

(10) Patent No.: US 7,525,248 B1
(45) Date of Patent: Apr. 28, 2009

(54) LIGHT EMITTING DIODE LAMP

(75) Inventor: Zhaoyang Fan, Manhattan, KS (US)

(73) Assignee: AC LED Lighting, L.L.C., Manhattan, KS (US)

( * ) Notice: Subject to any disclaimer, the term of this patent is extended or adjusted under 35 U.S.C. 154(b) by 444 days.

(21) Appl. No.: 11/340,296

(22) Filed: Jan. 26, 2006

Related U.S. Application Data

(60) Provisional application No. 60/647,069, filed on Jan. 26, 2005.

(51) Int. Cl.
*H01J 1/62* (2006.01)
(52) U.S. Cl. .................. 313/512; 313/498; 313/506
(58) Field of Classification Search ............... 313/498, 313/506, 512
See application file for complete search history.

(56) References Cited

U.S. PATENT DOCUMENTS

| | | | |
|---|---|---|---|
| 3,849,707 A | 11/1974 | Braslau et al. | |
| 3,900,863 A | 8/1975 | Kim | |
| 5,278,432 A | 1/1994 | Ignatious et al. | |
| 5,317,170 A | 5/1994 | Paoli | |
| 5,463,280 A | 10/1995 | Johnson | |
| 5,563,422 A | 10/1996 | Nakamura et al. | |
| 5,652,434 A | 7/1997 | Nakamura et al. | |
| 5,699,073 A | 12/1997 | Lebby et al. | |
| 5,767,581 A | 6/1998 | Nakamura et al. | |
| 5,773,130 A | 6/1998 | So et al. | |
| 5,877,558 A | 3/1999 | Nakamura et al. | |
| 5,929,466 A | 7/1999 | Ohba et al. | |
| 5,952,680 A | 9/1999 | Strite | |
| 5,955,748 A | 9/1999 | Nakamura et al. | |
| 5,966,393 A | 10/1999 | Hide et al. | |
| 6,054,724 A | 4/2000 | Ogihara et al. | |
| 6,093,965 A | 7/2000 | Nakamura et al. | |
| 6,316,793 B1 | 11/2001 | Sheppard et al. | |
| 6,396,081 B1 | 5/2002 | Tews et al. | |
| 6,410,940 B1 | 6/2002 | Jiang et al. | |
| 6,455,878 B1 | 9/2002 | Bhat et al. | |
| 6,461,019 B1 | 10/2002 | Allen | |
| 6,547,249 B2 | 4/2003 | Collins et al. | |
| 6,552,373 B2 | 4/2003 | Ando et al. | |

(Continued)

OTHER PUBLICATIONS

S X Jin, J Li, J Y Lin and H X Jiang, InGaN/GaN Quantum Well Interconnected Microdisk Light Emitting Diodes; Applied Physics Letters, vol. 77, No. 20, p. 3236-3238, Nov. 13, 2000.

(Continued)

*Primary Examiner*—Vip Patel
(74) *Attorney, Agent, or Firm*—Lathrop & Gage LLP

(57) ABSTRACT

A LED based solid-state light emitting device or lamp is built upon an electrically insulating layer that has been formed onto a support surface of a substrate. Specifically, the insulating layer may be epitaxially grown onto the substrate, followed by an LED buildup of an n-type semiconductor layer, an optically active layer, and a p-type semiconductor layer, in succession. Isolated mesa structure of individual, discrete LEDs is formed by etching specific portions of the LED buildup down to the insulating layer, thereby forming trenches between adjacent LEDs. Thereafter, the individual LEDs are electrically coupled together through conductive elements or traces being deposited for connecting the n-type layer of one LED and the p-type layer of an adjacent LED, continuing across all of the LEDs to form the solid-state light emitting device.

12 Claims, 3 Drawing Sheets

U.S. PATENT DOCUMENTS

| | | | |
|---|---|---|---|
| 6,583,446 B1 * | 6/2003 | Taninaka et al. | 257/93 |
| 6,635,902 B1 | 10/2003 | Lin et al. | |
| 6,642,652 B2 * | 11/2003 | Collins et al. | 313/512 |
| 6,740,960 B1 | 5/2004 | Farnworth et al. | |
| 6,787,820 B2 | 9/2004 | Inoue et al. | |
| 6,921,929 B2 | 7/2005 | LeBoeuf et al. | |
| 6,936,885 B2 | 8/2005 | Shin et al. | |
| 6,943,380 B2 | 9/2005 | Ota et al. | |
| 6,957,899 B2 | 10/2005 | Jiang et al. | |
| 6,992,319 B2 | 1/2006 | Fahimulla et al. | |
| 7,045,965 B2 | 5/2006 | Li et al. | |
| 7,210,819 B2 | 5/2007 | Jiang et al. | |
| 7,213,942 B2 | 5/2007 | Jiang et al. | |
| 7,221,044 B2 | 5/2007 | Fan et al. | |
| 7,285,801 B2 | 10/2007 | Eliashevich et al. | |
| 2002/0006040 A1 | 1/2002 | Kameda et al. | |
| 2002/0043943 A1 | 4/2002 | Menzer et al. | |
| 2002/0158258 A1 | 10/2002 | Chyi | |
| 2003/0057434 A1 | 3/2003 | Hata et al. | |
| 2003/0102482 A1 | 6/2003 | Saxler | |
| 2003/0116774 A1 | 6/2003 | Yamamoto et al. | |
| 2003/0178633 A1 | 9/2003 | Flynn et al. | |
| 2003/0218183 A1 | 11/2003 | Micovic et al. | |
| 2004/0080941 A1 | 4/2004 | Jiang et al. | |
| 2004/0129946 A1 | 7/2004 | Nagai et al. | |
| 2004/0195562 A1 | 10/2004 | Munns | |
| 2004/0206970 A1 | 10/2004 | Martin | |
| 2005/0127816 A1 | 6/2005 | Sumitani | |
| 2005/0133816 A1 | 6/2005 | Fan et al. | |
| 2005/0161682 A1 | 7/2005 | Mazzochette et al. | |
| 2005/0185401 A1 | 8/2005 | Jiang et al. | |
| 2005/0251698 A1 | 11/2005 | Lynch et al. | |
| 2005/0253151 A1 | 11/2005 | Sakai et al. | |
| 2005/0254243 A1 | 11/2005 | Jiang et al. | |
| 2006/0044864 A1 | 3/2006 | Lin et al. | |
| 2006/0163589 A1 | 7/2006 | Fan et al. | |
| 2006/0169993 A1 | 8/2006 | Fan et al. | |
| 2006/0180818 A1 | 8/2006 | Nagai et al. | |
| 2006/0208264 A1 | 9/2006 | Ryu et al. | |
| 2007/0273299 A1 | 11/2007 | Miskin et al. | |

OTHER PUBLICATIONS

Mair et al., Optical properties of GaN/AlGaN multiple quantum well microdisks, Nov. 17, 1997, Appl. Phys, Lett. 76 (5) p. 631, American Institute of Physics.

Chen, Chang, Chen, Fann, Jiang, and Lin; Mechanism of Photoluminescence in GaN/Al(0.2)Ga(0.8)N Superlattices; Applied Physics Letters, vol. 79, No. 23; Dec. 3, 2001.

Jiang and Lin; On Display; OE Magazine Jul. 2001.

C. W Jeon, H.W, Choi and M.D. Dawson; A Novel Fabrication Method For A 64×64 Matrix- Addressable GaN-Based Micro-LED Array; Phys. Stat. Sol. (a) No. 1, 78-82, 2003.

Kansas Researchers Fabricate Blue Micro Light-Emitting Diodes, Paving Way for Microdisplays, Energy Saving Lighting; Ascribe The Public Interest Newswire, Sep. 27, 2001.

Zhaoyang Fan, Hongxing Jiang, Jingyu Lin; Related and Copending U.S. Appl. No. 11/144,982, filed Jun. 3, 2005.

* cited by examiner

US 7,525,248 B1

LIGHT EMITTING DIODE LAMP

CROSS-REFERENCE TO RELATED APPLICATIONS

This application claims priority to commonly owned U.S. provisional application Ser. No. 60/647,069, filed Jan. 26, 2005, incorporated by reference in its entity.

STATEMENT REGARDING FEDERALLY SPONSORED RESEARCH OR DEVELOPMENT

Not applicable.

BACKGROUND OF THE INVENTION

The popularity of LEDs in various applications where illumination is needed is on the rise. Although traditionally utilized for indicator lights, background display illumination and other applications where low-level illumination is sufficient, the realization of high brightness blue/green and violet LEDs made from the III-nitride semiconductor family (such as InN, GaN, AlN and their alloys) has dramatically increased the utility of LEDs in providing general illumination for a variety of settings, including residential houses and commercial buildings. Because solid-state lighting LEDs (SSL-LEDs or LED lamps) are quite efficient in light output per watt of power consumed, and are sufficiently versatile to be capable of use in a variety of locations where illumination is needed, LED lamps have the potential to replace traditional incandescent or fluorescent lamps in many lighting applications. The use of LED lamps, therefore, will enable overall electrical energy consumption to be reduced, while providing a very durable lighting source that is virtually maintenance free. Furthermore, materials used to form LED chips and associated coatings allow LED lamps to be independently tunable in terms of light intensity and visible spectrum color output.

Because traditional LED illuminators operate under a low DC voltage supply, these LEDs have required voltage down-conversion transformers and other circuitry to operate in general lighting applications where a standard AC power source of 110/120 or 220/240 volts is supplied (e.g., in a residence or other building). To overcome the need for such circuitry, while achieving a high luminance for general lighting applications, an LED lamp has been developed that runs on high input power generated by high DC or AC voltage. One implementation of a high AC voltage LED lamp is disclosed in U.S. Pat. No. 6,957,899, issued on Oct. 25, 2005, and entitled "Light Emitting Diodes For High AC Voltage Operation and General Lighting". The '899 patent teaches integrating many individual E-Nitride LEDs onto a single chip or wafer grown, for instance, on an electrically insulating sapphire substrate, with serial interconnection between the LEDs to achieve a single light emitting device, or lamp. The LED lamp can be configured to have a running voltage of 12V, 24V, 110/120V, 220/240V, or other values. This is achieved in the invention of the '899 patent by having two columns of individual LEDs each in serial interconnection and wired in opposing polarities such that one column of LEDs is forward biased and the other column is reverse biased.

FIGS. 1a-1c illustrate an exemplary high voltage AC or DC powered SSL-LED lamp, such as the LED lamp of the '899 patent. With particular attention to FIG. 1a, the first phase of an LED buildup 10 or layered structure is shown. The individual layers forming the LED buildup 10 are deposited onto a generally electrically insulating substrate 12. More specifically, a buffer layer 14 with a typical thickness of about 0.05 micron of semiconductor material is first deposited onto the substrate 12, followed by a layer 16 of n-type semiconductor material, in one example, a 2-4 μm layer of n-type gallium nitride (n-GaN). An optically active region 18 is then formed by depositing a layer of light-emission material onto the n-type semiconductor layer 16, such as indium gallium nitride/gallium nitride multiple quantum wells (InGaN/GaN MQW), followed by a layer 20 of p-type semiconductor material, such as p-GaN, deposited onto the optically active region 18. FIG. 1b shows the LED layered structure that has been etched down (e.g., through dry or wet chemical etching) to the insulating substrate 12, thereby forming an isolated mesa structure of multiple discrete LEDs 22 spaced across the substrate 12. Each LED 22 also has both the n-type 16 and p-type layers 20 exposed so that a conductive trace 24 (e.g., deposited Ni/Au metal stacks) may be extended between a p-type ohmic contact 26 of one LED 22 and an n-type ohmic contact 28 of an adjacent LED 22, as depicted in FIG. 1c. An insulating material 30, such as silicon oxide, is disposed along a wall of the layered buildup beneath the conductive trace 24 to isolate the n-type layer 16 from the p-type layer 20 of the same LED 22, which would short circuit the LED 22 and inhibit electrical interconnection of the LEDs across an SSL-LED lamp 32.

As can be understood, the SSL-LED lamp 32 of FIGS. 1a-1c is fabricated onto the electrically insulating substrate 12 in order to prevent an improper conductive path being formed between the n-type layers 16 of adjacent LEDs 22 through the substrate 12 and the respective buffer layers 14, which would result if the substrate was formed of a material possessing a sufficiently high level of electrical conductivity. As one example, for LEDs formed by GaN-based semiconductor growth, sapphire or silicon carbide (SiC) substrates have been widely used. Both of these substrate types have disadvantages. Sapphire substrates have low thermal conductivity, which inhibits the dissipation of heat generated when an LED is in operation. This excessive heat reduces the light output of individual LEDs and shortens the lifespan of the lamp. In the case of silicon carbide substrates, a high thermal conductivity is realized. SiC substrates also provide a lower lattice mismatch with GaN-based semiconductors as compared to a sapphire substrate, resulting in GaN-based semiconductors possessing high crystal quality and strong illumination performance for the underlying LED. Still, SiC is a somewhat electrically conductive, and thus is a less than ideal substrate for building an LED lamp. It has also been suggested to use Silicon alone as a substrate, because it is relatively inexpensive and provides a foundation onto which an integrated protection circuit for LEDs can be built. Unfortunately, silicon is also somewhat conductive, and thus is disadvantageous for the reasons stated above. The same issue with semi conductive substrates arises with AlInGaP-based LEDs, where typical substrates formed of GaAs and InP are also semiconductors.

Turning to AlInGaN-based LEDs, additional problems arise because of the frequent need to provide an etching depth of 4 μm or more when forming the isolated mesa structure of multiple individual LEDs 22, as shown in FIG. 1b. This etching depth creates deep trenches between adjacent LEDs 22. These deep trenches make it difficult to properly form the conductive traces 24 that extend between the p-n junctions of the LEDs 22 (as shown in FIG. 1c), leading to poor quality electrical isolation of n-type layers 16 of adjacent LEDs 22 and an increase in electrical resistance within the SSL-LED lamp 32. Therefore, it is desirous to improve LED construction to provide reliable and consistent performance in illumination applications where relatively high voltage AC or DC power is supplied.

SUMMARY OF THE INVENTION

The present invention provides a chip-scale LED lamp including discrete LEDs capable of being built upon electrically insulative, electrically conductive, or electrically semi conductive substrates. Further, the construction of the LED lamp enables the lamp to be configured for high voltage AC or DC power operation.

In one aspect, the LED based solid-state light emitting device or lamp is built upon an electrically insulating layer that has been formed onto a support surface of a substrate. Specifically, the insulating layer may be epitaxially grown onto the substrate, followed by an LED buildup of an n-type semiconductor layer, an optically active layer, and a p-type semiconductor layer, in succession. Isolated mesa structure of individual, discrete LEDs is formed by etching specific portions of the LED buildup down to the insulating layer, thereby forming trenches between adjacent LEDs. Thereafter, the individual LEDs are electrically coupled together through conductive elements or traces being deposited for connecting the n-type layer of one LED and the p-type layer of an adjacent LED, continuing across all of the LEDs to form the solid-state light emitting device. The device may therefore be formed as an integrated AC/DC light emitter with a positive and negative lead for supplied electrical power. For instance, the LED lamp may be configured for powering by high voltage DC power (e.g., 12V, 24 V, etc.) or high voltage AC power (e.g., 110/120V, 220/240V, etc.).

BRIEF DESCRIPTION OF THE SEVERAL VIEWS OF THE DRAWINGS

In the accompanying drawings, which form a part of the specification and are to be read in conjunction therewith and in which like reference numerals are employed to indicate like parts in the various views.

DETAILED DESCRIPTION OF THE INVENTION

The various figures described in detail below show the solid-state lighting or "chip-scale" LED lamp of the present invention that incorporates an electrically insulative epitaxially grown layer between LED component layers and a substrate upon which individual, discreet LEDs are formed. In various embodiments of the invention, this allows for the use of a electrically conductive, semi-conductive or insulating substrate in an LED lamp design, with the material for the insulating layer preferably selected according to the properties of the substrate and the LED materials, as well as the light emitting characteristics desired (e.g., illumination intensity or wavelength). By use of such a high quality insulating layer, the n-type semiconductor thickness can be significantly reduced from the prior art. Furthermore, the insulating layer of the current invention does not have to be etched through to electrically separate adjacent LEDs, resulting in a reduced trench depth in the etching process. This is advantageous because a deep, narrow trench creates difficulties in depositing the conductive traces at the correct locations for LED interconnection across the substrate. Therefore, the LED lamp can be fabricated more quickly and with a greater chance of forming reliable interconnectivity between the discreet LEDs. Additionally, in certain embodiments, thermally conductive substrates may be implemented into the design so that excessive thermal energy generated in high voltage AC/DC LED lamp operation can be quickly dissipated without compromising the integrity of the lamp components.

Figure 2A:
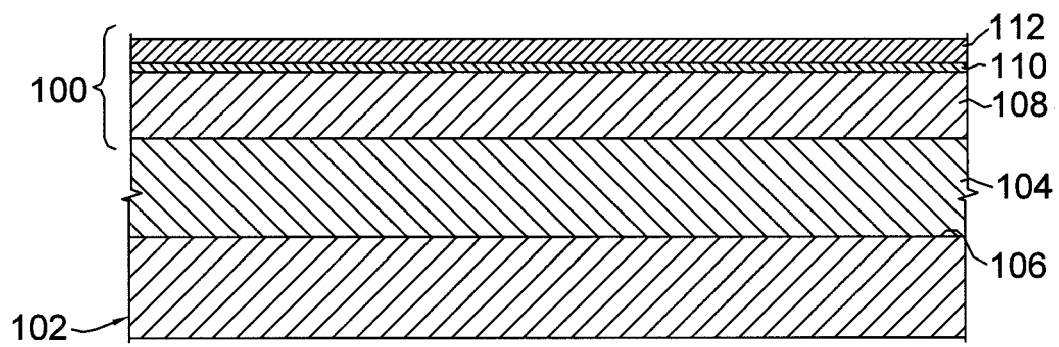
FIGS. 2a and 2b show a cross-sectional view of an LED build up having a insulating layer separating LED component layers from the substrate, as well as discreet LED mesa structure serially interconnected to form a chip-scale LED lamp in accordance with one embodiment of the present invention.

Turning to FIG. 2a, one LED buildup 100 is shown build upon a substrate 102 that can be electrically conductive, semi-conductive or insulating. For instance, the substrate 102 may be formed to be electrically conductive or semi-conductive from a material such as silicon carbide (SiC), silicon (Si), gallium nitride (GaN), indium phosphide (InP) or gallium arsenic (GaAs), or a combination thereof, among others. On the other hand, the substrate 102 may be formed to be electrically insulative from a material such as combined sapphire and aluminum oxide ($Al_2O_3$), highly resistive silicon carbide (SiC), highly resistive silicon (Si), or highly resistive aluminum nitride (AlN), or a combination thereof, among others. An electrically insulating layer 104 that supports the LED buildup 100 may be epitaxially grown onto a support surface 106 (i.e., upper surface) of the substrate 102 at high temperature. For instance, the insulating layer 104 may be formed from a material such as highly electrically resistive aluminum nitride film (AlN), an aluminum gallium nitride (AlGaN) alloy and an aluminum indium gallium nitride (AlInGaN) alloy, the particular material being chosen according to the properties of the substrate selected and the particular LED buildup, such as in keeping with a desire to provide a low lattice mismatch and strong illumination characteristics at a particular wavelength. As an example, a SiC substrate 102 may have an AlN film epitaxially grown thereon at a thickness of about 1 μm, or greater, to serve as the insulating layer 104, due to the fact that AlN has a closer lattice match with SiC and generally presents high crystal quality. Optionally, a low-temperature grown buffer may be integrated with the other materials forming the insulating layer 104.

Figure 2B:
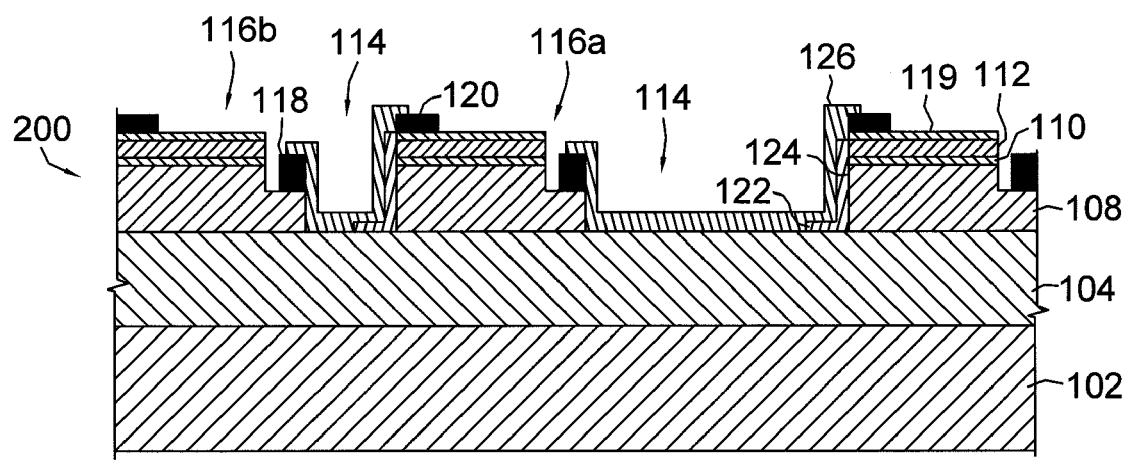

Continuing with the LED buildup an n-type semiconductor layer 108 is deposited or grown upon the insulating layer 104, followed by an optically active region 110 and a p-type semiconductor layer 112, in succession. An exemplary n-type layer 108 material may be n-GaN, while an exemplary p-type layer 112 material may be InGaN/GaN MQW. Those of skill in the art will appreciate that other materials may be selected as a matter of design choice. As seen in FIG. 2b, an etching process through selected portions of the LED buildup 100 creates a series of interconnected trenches 114 between adjacent mesa structure forming individual, discrete LEDs 116. In the case of the insulating layer 104 having a thickness of at least 1 μm, this ensures that controlled etching is not likely to extend through the layer 104 to the substrate beneath 102. Therefore, the integrity of the electrical isolation between adjacent LEDs 116 is ensured by the insulating layer 104. Further, by utilizing the insulating layer 104, the thickness of the n-type layer 108 can be significantly reduced from the prior art.

FIG. 2B illustrates a representative portion of an integrated LED lamp 200 of the present invention. From the etched structure of FIG. 2A, an n-type contact 118 (e.g., Ti/Al metal stack) is deposited on an exposed portion n-type layer 108 and annealed, followed by a substantially transparent metal layer 119 on the p-type layer 112, and a p-type contact 120 on a portion of the metal layer 119. The metal layer 119, for example, may a transparent Nickel/Gold (Ni/Au) layer that is several nanometers thick and preferably annealed in a high oxygen environment for improving the distribution of electrical current applied thereto across the p-type layer 112 to maximum light output. An electrically insulating material trace 122 is formed through each trench 114 at least along the LED sidewall 124 from the p-type contact 120 to the base of the n-type layer 108. This ensures that an electrically conductive material trace 126 extending from the p-type contact 120 of a first LED 116a to a n-type contact 118 of another LED 116b interconnected therewith does not short circuit the respective LED 116 when an electrical current is applied to positive and negative junctions (not shown) of the LED lamp 200.

Figure 1A:
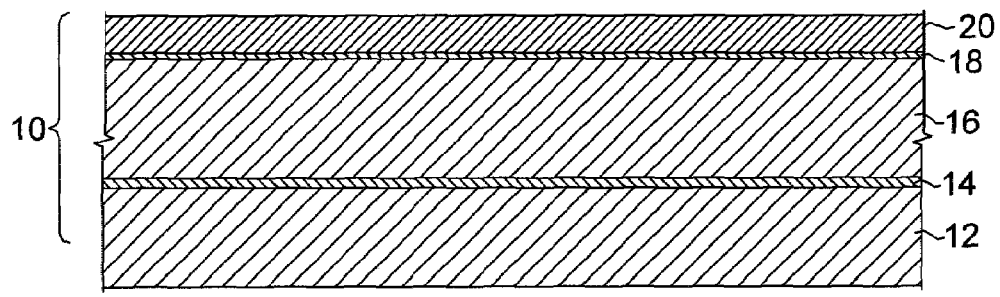
FIGS. 1a-1c show various cross-sectional views of a prior art LED build up, trenches where etching is performed, and conductive elements interconnecting adjacent LEDs.
Figure 1B:
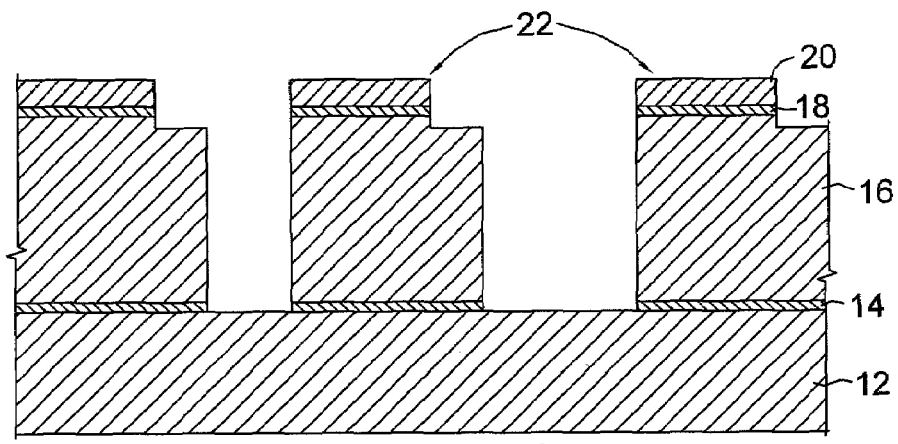
Figure 1C:
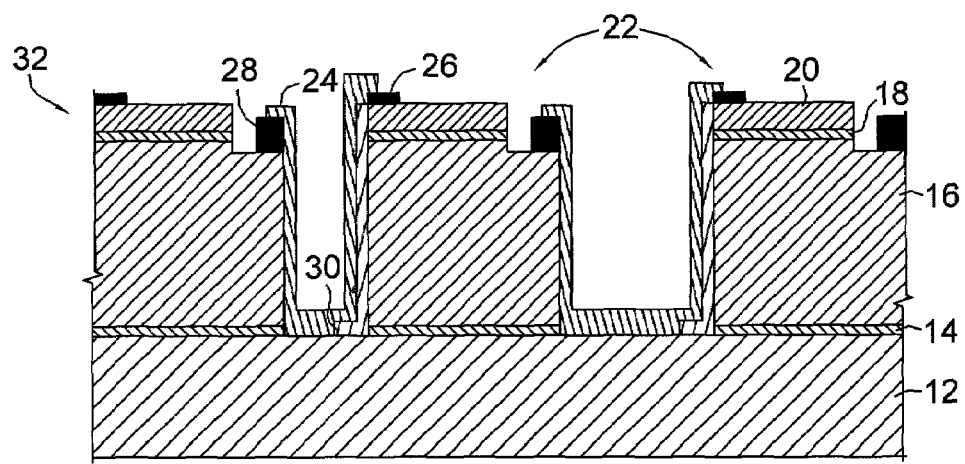

The structure of the LED lamp 200 provides a distinct advantage over prior LED lamp structures, as referenced above, due to more shallow trenches 114 being formed. For instance, in the lamp design depicted in FIG. 1c, it is common for the conductive trace 24 and insulating deposition 30 to pass through a trench having a depth of 3-6 μm and a width of less than about 5 microns. A common LED fabrication method is to use material deposition and lift-off, which is a tedious and somewhat unreliable process when attempting to create a uniformly thick and unbroken conductive or insulative material trace through such a deep and narrow trench. Even if LED short-circuiting can be avoided, if the conductive trace has an insufficient thickness, excessive electrical resistance will be encountered in the LED lamp, degrading illumination performance. The use of the insulating layer 104 enables an individual LED 116 to have a height of preferably less than about 2 μm, which improves the probability of electrically insulating and conductive traces being properly deposited on the LED lamp 200. These "low height" LEDs would not be possible with the use of a buffer layer alone between the LED buildup 100 and the underlying substrate 102.

Figure 3:
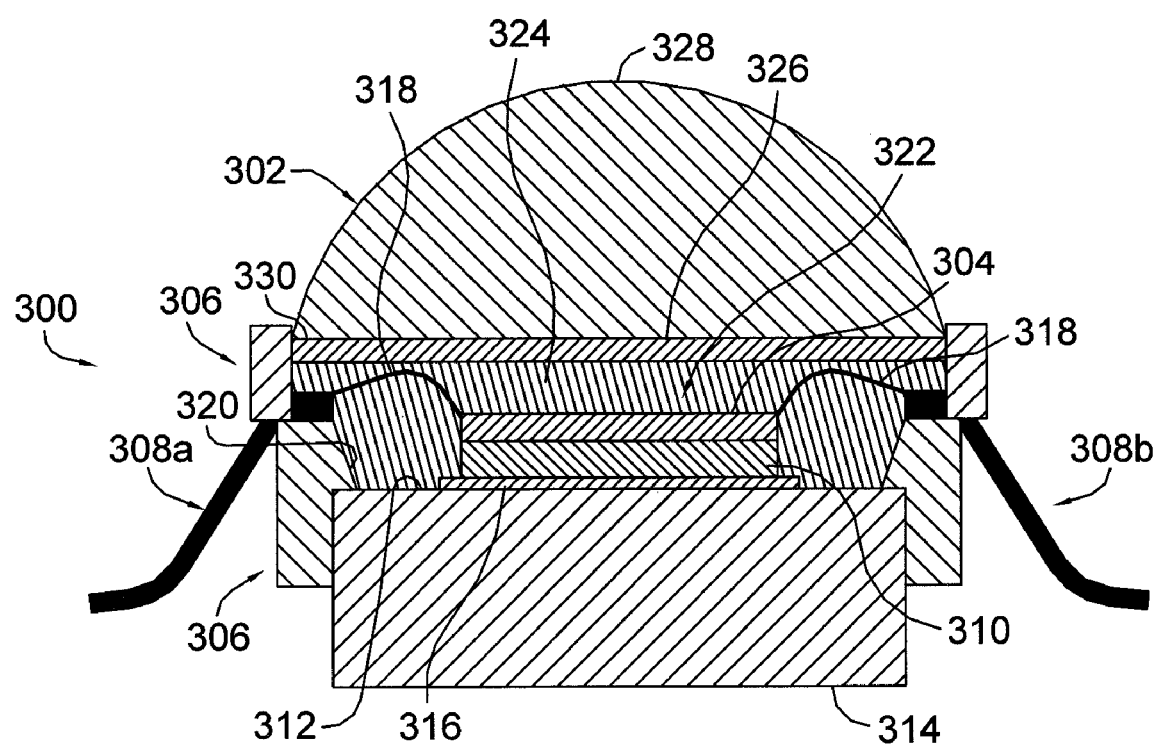
FIG. 3 shows a cross-sectional view of an LED built upon a thermally conductive substrate integrated into an encapsulated package to form an integrated light emitter.

Turning to FIG. 3, an integrated LED light emitter 300 is presented. Preferably, an encapsulating package 302 covering an LED die 304 (e.g., the LED lamp 200 construction of FIG. 2b) is bounded by an insulation sidewall 306, in order to protect the integrity of the emitter 300. Positive and negative electrical leads 308a and 308b extending from the package 302 interconnect with either other emitters 300 or directly to a power source, such as a high voltage AC or DC source. Because of the specific construction, the LED light emitter 300 is built directly on a substrate without having to mount individual LED dies 304 in an upside-down fashion in order to achieve sufficient thermal dissipation.

The specific construction of the LED light emitter 300 involves mounting the LED die 304 having a thermally conductive substrate 310 in an upright arrangement onto a top surface 312 of a heat sink submount 314, or slug. The substrate 310 may also be electrically conductive, to maximize the thermally conductive properties. Exemplary substrates 310 include those formed of electrically conductive SiC, Si, and GaN, among others. The submount 314 is preferably formed of a thermally conductive metal, such as aluminum or copper. A thermally conductive paste (e.g., silver epoxy) or solder layer 316 (e.g., Au/Sn eutectic allow) may be used to bond the substrate 310 on the submount 314. Conductive wires 318 are coupled with a p-junction (not shown) and a n-junction (not shown) of the LED die 304, such as through wire bonding, for extension to the positive and negative electrical leads 308a and 308b that bring electrical power to the LEDs of the die 304. The insulating sidewall 306 surrounds the submount 314 at least at the top surface 312 thereof, and extends upwardly with an outward taper on an inner surface 320 of the sidewall 306. The sidewall inner surface 320 is also coated with a reflective layer, such as silver or aluminum, to act as a reflecting cup collecting light emitter from the LED die 304 in lateral and downward directions. The insulating sidewall 306 continues upwardly for a distance above the height of the LED die 304 to form a containment area 322 where an encapsulation gel 324 may be deposited to encase the die 304, substrate 310, submount 314 and conductive wires 318. The encapsulation gel 324 specifically protects the die 304 and bonding of the conductive wires 318 with the die 304 and the leads 308a, 308b, while also enhancing light extraction of the LEDs. Additionally, the sidewall 306 has apertures (not shown) through which the electrical leads 308a and 308b extend to connect with the conductive wires 318, and the encapsulation gel 324 ensures that any gaps through the apertures around the leads 308a, 308b are plugged. As one example, the encapsulation gel 324 may be LS-3357 type encapsulation gel available from Lightspan, LLC. Deposited on the encapsulation gel 324 is one or more color conversion phosphor layers 326, or equivalent materials. Finally, an hemispherical encapsulation lens 330 is molded on top of the phosphor layer 326, as well as onto the encapsulation gel 324 if the phosphor layer 326 does not cover the entire exposed surface of the gel 324. The insulating sidewall 306 preferably extends upwardly a sufficient distance as to laterally support the phosphor layer 326 and lower edge 330 of the encapsulation lens 328, thereby protecting the integrity of the LED light emitter 300 and properly directing the emitted light in the proper orientation through the lens 328.

While particular embodiments of the invention have been shown, it will be understood, that the invention is not limited thereto, since modifications may be made by those skilled in the art, particularly in light of the foregoing teachings. Reasonable variation and modification are possible within the scope of the foregoing disclosure of the invention without departing from the spirit of the invention.

What is claimed is:

1. A LED based solid-state light emitting device comprising:
    a substrate having a support surface bonded to a heat sink;
    an electrically insulating layer formed on the support surface of the substrate;
    one or more electrically conductive elements disposed on the insulating layer;
    an array of discrete LEDs coupled with the insulating layer and electrically connected with one another in series through the one or more conductive elements; and an encapsulation gel covering at least a portion of the substrate, the electrically insulating layer, the one or more LEDs and at least a portion of the set of electrically conductive elements.

2. The device of claim 1, wherein the insulating layer is an epitaxial layer.

3. The device of claim 1, wherein a trench is formed between adjacent LEDs of the array of discrete LEDs having a depth defined as a vertical height measured between the insulating layer and the top of the respective adjacent LEDs.

4. The device of claim 1, wherein the substrate is formed of at least one material selected from the group consisting of: silicon carbide, silicon, gallium nitride, indium phosphide and gallium arsenic.

5. The device of claim 1, wherein the insulating layer is formed of at least one material selected from the group consisting of: highly resistive aluminum nitride, an aluminum gallium nitride alloy and an aluminum indium gallium nitride alloy.

6. The device of claim 1, wherein the substrate is formed as electrically insulative.

7. The device of claim 6, wherein the substrate is formed of at least one material selected from the group consisting of: the combination of sapphire and aluminum oxide, highly resistive silicon carbide, highly resistive silicon, and highly resistive aluminum nitride.

8. The device of 6, wherein the insulating layer is formed of at least one material selected from the group consisting of: highly resistive aluminum nitride, aluminum gallium nitride and aluminum indium gallium nitride.

9. The device of claim 1, wherein each LED of the array of discrete LEDs has a p-type contact connected with one of the conductive elements and a n-type contact connected with another one of the conductive elements, wherein the conductive element connected with the p-type contact of a respective LED extends to another n-type contact of a first adjacent LED, and the conductive element connected with the n-type contact of the respective LED extends to another p-type contact of a second adjacent LED.

10. A LED based solid-state light emitting device comprising:

a non-electrically insulative substrate bonded to a heat sink submount;
an electrically insulating layer formed on the support surface of the substrate;
one or more LEDs formed on the insulating layer each having a n-type semiconductor layer, an optically active layer, and a p-type semiconductor layer, the one or more LEDs being electrically coupled with one another in series;
a set of electrically conductive elements each extending from the one or more LEDs to an electrical lead; and
an encapsulation gel covering at least a portion of the substrate, the electrically insulating layer, the one or more LEDs and at least a portion of the set of electrically conductive elements.

11. The device of claim 10, further comprising:
one or more color conversion phosphors disposed onto the encapsulation gel above the one or more LEDs;
an encapsulation lens formed on top of the one or more color conversion phosphors.

12. The device of claim 11, further comprising an electrically insulative sidewall surrounding at least the substrate, the electrically insulating layer, the one or more LEDs, and the encapsulation gel, wherein the sidewall defines a boundary for the encapsulation gel.

* * * * *